(12) United States Patent
Egawa

(10) Patent No.: US 7,215,031 B2
(45) Date of Patent: May 8, 2007

(54) MULTI CHIP PACKAGE

(75) Inventor: Yoshimi Egawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/985,020

(22) Filed: Nov. 10, 2004

(65) Prior Publication Data

US 2006/0097374 A1    May 11, 2006

(51) Int. Cl.
*H01L 23/48* (2006.01)
*H01L 23/52* (2006.01)

(52) U.S. Cl. ............ 257/773; 257/686; 257/777; 257/784; 257/E23.025

(58) Field of Classification Search ........... 257/773
See application file for complete search history.

(56) References Cited

U.S. PATENT DOCUMENTS

| | | | | |
|---|---|---|---|---|
| 5,933,712 A * | 8/1999 | Bernhardt et al. | ......... | 438/125 |
| 5,990,500 A * | 11/1999 | Okazaki | ......... | 257/99 |
| 6,137,185 A * | 10/2000 | Ishino et al. | ......... | 257/786 |
| 6,175,153 B1 | 1/2001 | Yamada | ......... | 257/737 |
| 6,710,455 B2 * | 3/2004 | Goller et al. | ......... | 257/777 |
| 6,930,396 B2 * | 8/2005 | Kurita et al. | ......... | 257/777 |
| 2002/0030262 A1 * | 3/2002 | Akram | ......... | 257/686 |
| 2003/0080428 A1 * | 5/2003 | Izumitani et al. | ......... | 257/758 |
| 2003/0214795 A1 * | 11/2003 | Sakuyama | ......... | 361/767 |
| 2004/0026781 A1 * | 2/2004 | Nakai | ......... | 257/737 |
| 2004/0119172 A1 * | 6/2004 | Downey et al. | ......... | 257/784 |

FOREIGN PATENT DOCUMENTS

JP    2000-068322    3/2000

* cited by examiner

*Primary Examiner*—Tu-Tu Ho
(74) *Attorney, Agent, or Firm*—Rabin & Berdo, P.C.

(57) ABSTRACT

A multi chip package includes a substrate; a first semiconductor chip mounted on the substrate; a second semiconductor chip mounted above the first semiconductor chip; a first bonding wire electrically coupled to a first bonding pad on the first semiconductor chip; and a second bonding wire electrically coupled to a second bonding pad on the second semiconductor chip. At least the first bonding wire is of a coated wire, which comprises a conductive core and an outer insulation coating. At least the first bonding pad is of a multi layered pad, comprising a base pad formed on the first semiconductor chip; a first conductive layer formed on the base pad; and a second conductive layer formed on the first conductive layer.

26 Claims, 19 Drawing Sheets

MULTI CHIP PACKAGE

TECHNICAL FIELD OF THE INVENTION

The present invention relates to a MCP (Multi Chip Package) and a FBGA (Fine pitch Ball Grid Array) structure.

BACKGROUND OF THE INVENTION

A conventional multi chip package (MCP) includes a substrate, a first IC chip mounted on the substrate and a second IC chip mounted on the first IC chip. The substrate is provided with bonding posts thereon. The first and second IC chips and the bonding posts are wire bonded with thin bonding wires. The first and second IC chips are molded with a resin. Solder balls are arranged on the bottom surface of the substrate.

For wiring between the first and second IC chips, stud bumps may be used in order to improve bonding strength. However, when stud bumps are employed for a MCP, the productivity would be decreased. On the other hand, recently, a coated wire has been used for electrical connection among IC chips and a substrate so as to prevent the bonding wires from being contact with each other. However, both the stud bumps and coated wires cannot be used together. It is impossible to break the coating of the coated wires on the stud bumps, which are soft. Further, it is required to reduce mechanical stress under bonding pads, which are generated in a wire bonding process. Such mechanical stress is remarkable when coated wires are used.

OBJECTS OF THE INVENTION

Accordingly, it is an object of the present invention to provide a multi chip package in which mechanical stress under bonding pads are remarkably reduced.

Another object of the present invention to provide a multi chip package which can be fabricated with a higher productivity.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to the present invention, a multi chip package includes a substrate; a first semiconductor chip mounted on the substrate; a second semiconductor chip mounted above the first semiconductor chip; a first bonding wire electrically coupled to a first bonding pad on the first semiconductor chip; and a second bonding wire electrically coupled to a second bonding pad on the second semiconductor chip. At least the first bonding wire is of a coated wire, which comprises a conductive core and an outer insulation coating. At least the first bonding pad is of a multi layered pad, which includes a base pad formed on the first semiconductor chip; a first conductive layer formed on the base pad; and a second conductive layer formed on the first conductive layer.

Preferably, the base pad is of aluminum; the first conductive layer is of nickel (Ni); and the second conductive layer is of gold (Au). The first and second conductive layers may be formed by electroless deposition technique. The first and second conductive layers may be formed to have a thickness of 3 to 5 μm and a thickness of 0.05 to 0.1 μm, respectively.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
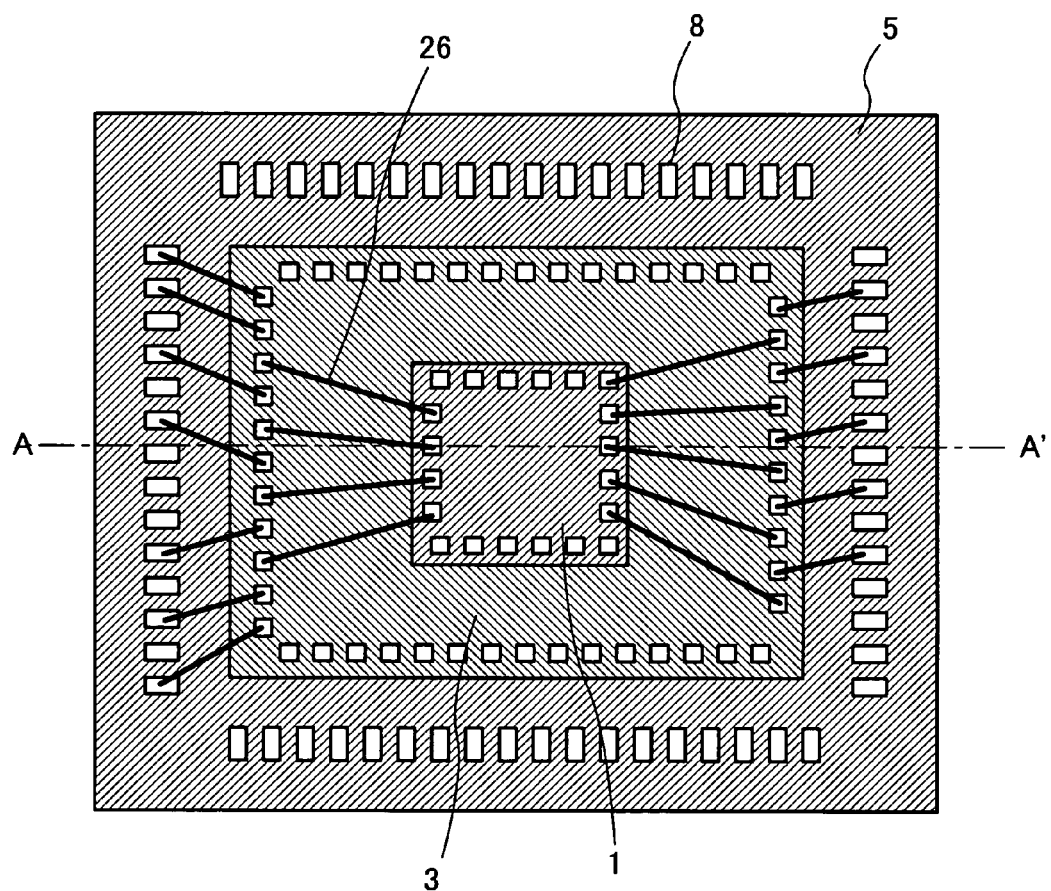
FIG. 1 is a plan view showing a conventional MCP (multi Chip Package).
Figure 2:
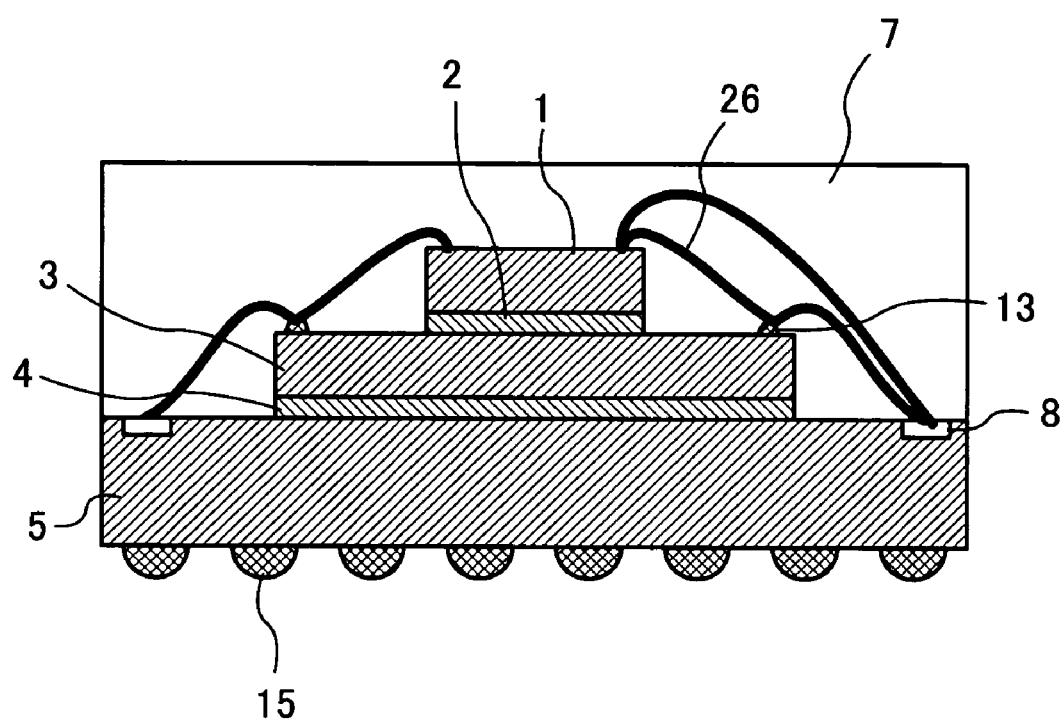
FIG. 2 is a cross-sectional view taken on line A–A' in FIG. 1.

FIG. 1 is a plan view showing a conventional MCP (multi Chip Package). FIG. 2 is a cross-sectional view taken on line A–A' in FIG. 1. The conventional MCP includes a substrate 5, an IC chip 3 mounted on the substrate 5 with an adhesive layer 4 and an IC chip 1 mounted on the IC chip 3 with an adhesive layer 2. Bonding posts 8 are formed at an peripheral on the substrate 5. Stud bumps 13 are formed on the IC chips 1 and 3. The stud bumps 13 on the IC chip 1 and the stud bumps 13 on the IC chip 3 are wired with a bonding wire 26 to each other. The stud bumps 13 on the IC chip 1 and the stud bumps 13 on the IC chip 3 are also wired with the bonding wire 26 to the bonding posts 8 of the substrate 5. The IC chips 1 and 3 are molded with a resin 7.

After the IC chips 1 and 3 are molded with the resin 7, solder terminals 15 are provided on the bottom surface of the substrate 5. The substrate 5 may be cut to form a plurality of individual FBGA packages.

Figure 3:
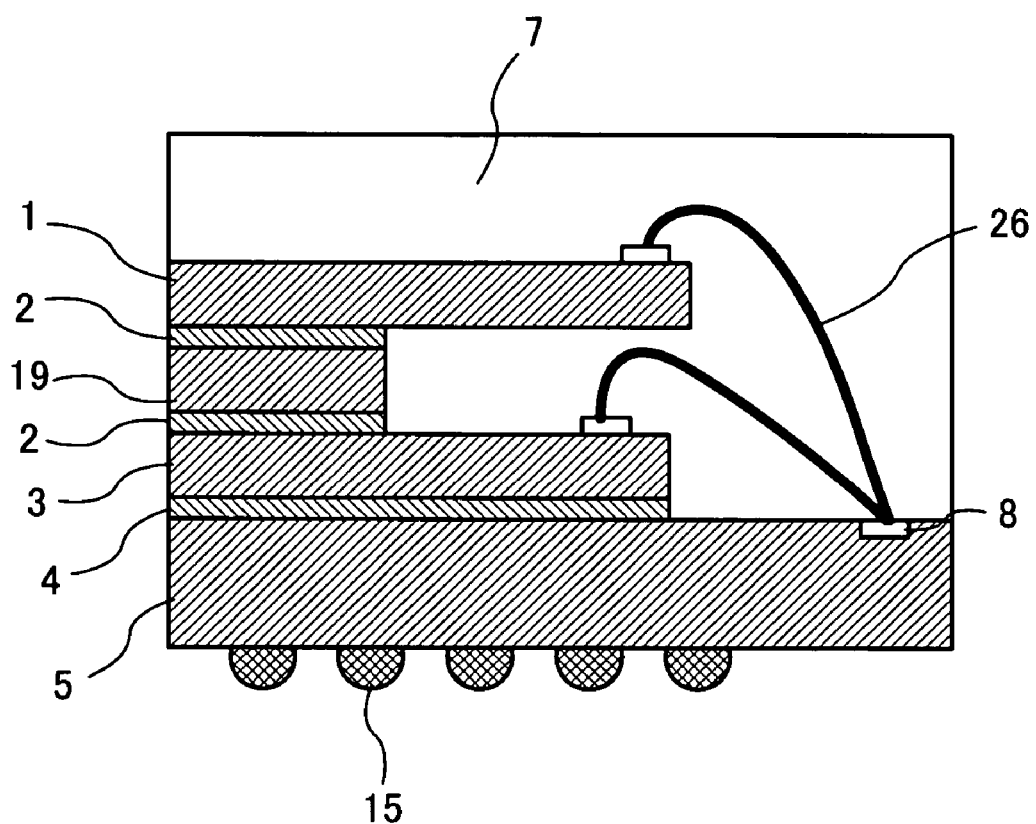
FIG. 3 is a part of cross-sectional view showing another conventional MCP.

FIG. 3 is a part of cross-sectional view showing another conventional MCP, in which a spacer chip 19 is arranged between the upper and lower IC chips 1 and 3 using adhesive layers 2. This type of technique is used when the IC chips 1 and 3 are shaped to be similar or same in size. According to the MCP, the package is fabricated to have a larger thickness.

Figure 4:
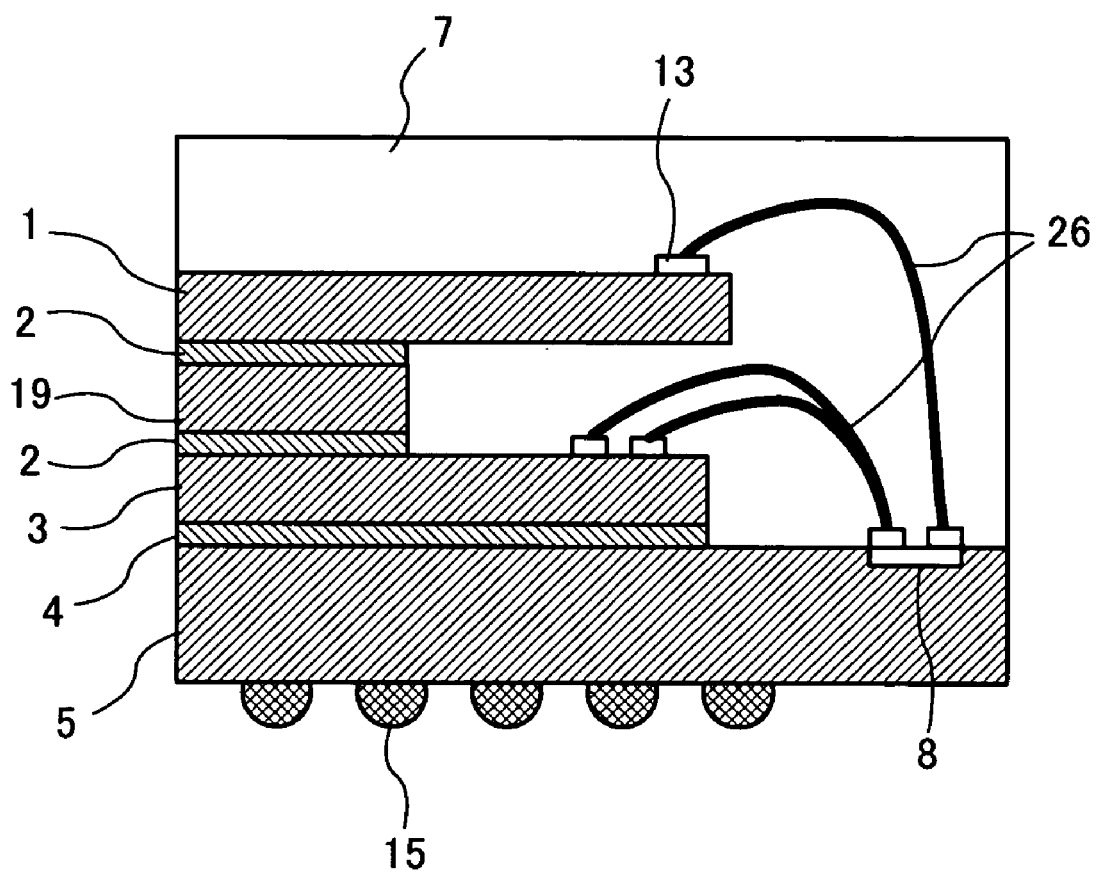
FIG. 4 is a part of cross-sectional view showing another conventional MCP.

FIG. 4 is a part of cross-sectional view showing another conventional MCP, in which bonding posts 8 and stud bumps 13 are arranged in grid or lattice shape. According to this type of MCP, the bonding wires 26 are easily in contact with each other, and a short circuit is generated.

Figure 5:
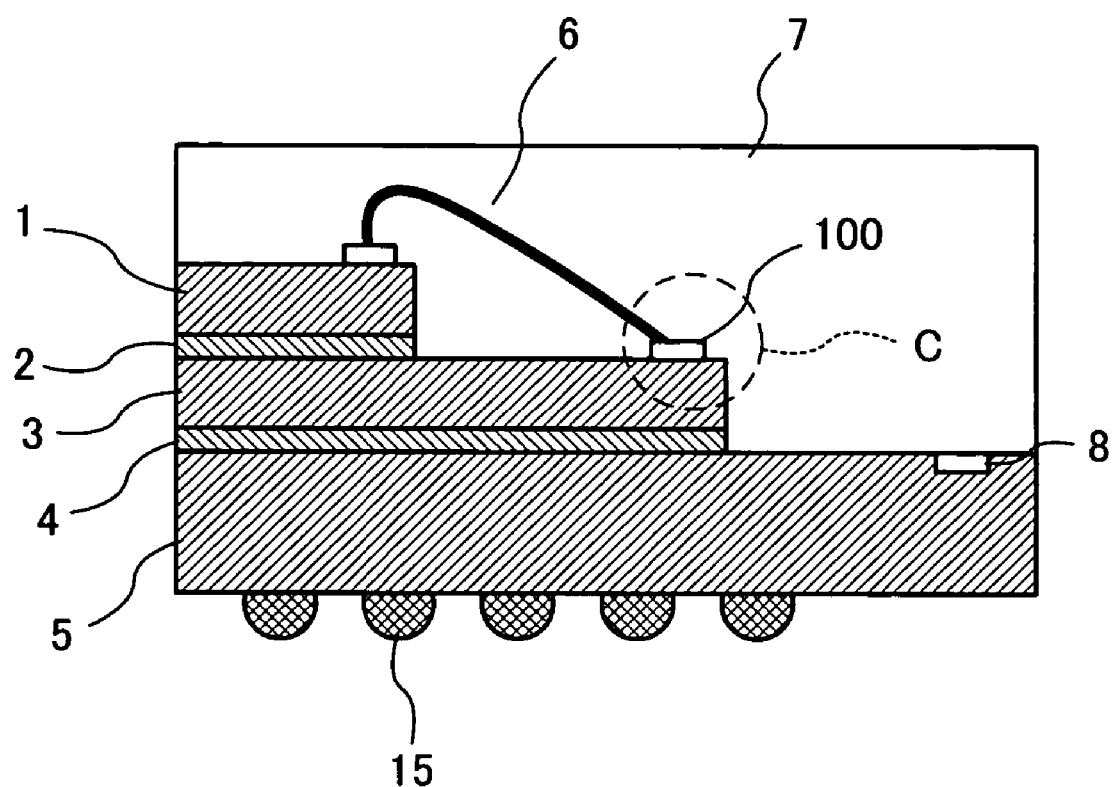
FIG. 5 is a cross-sectional view taken on line A–A' in FIG. 6
Figure 6:
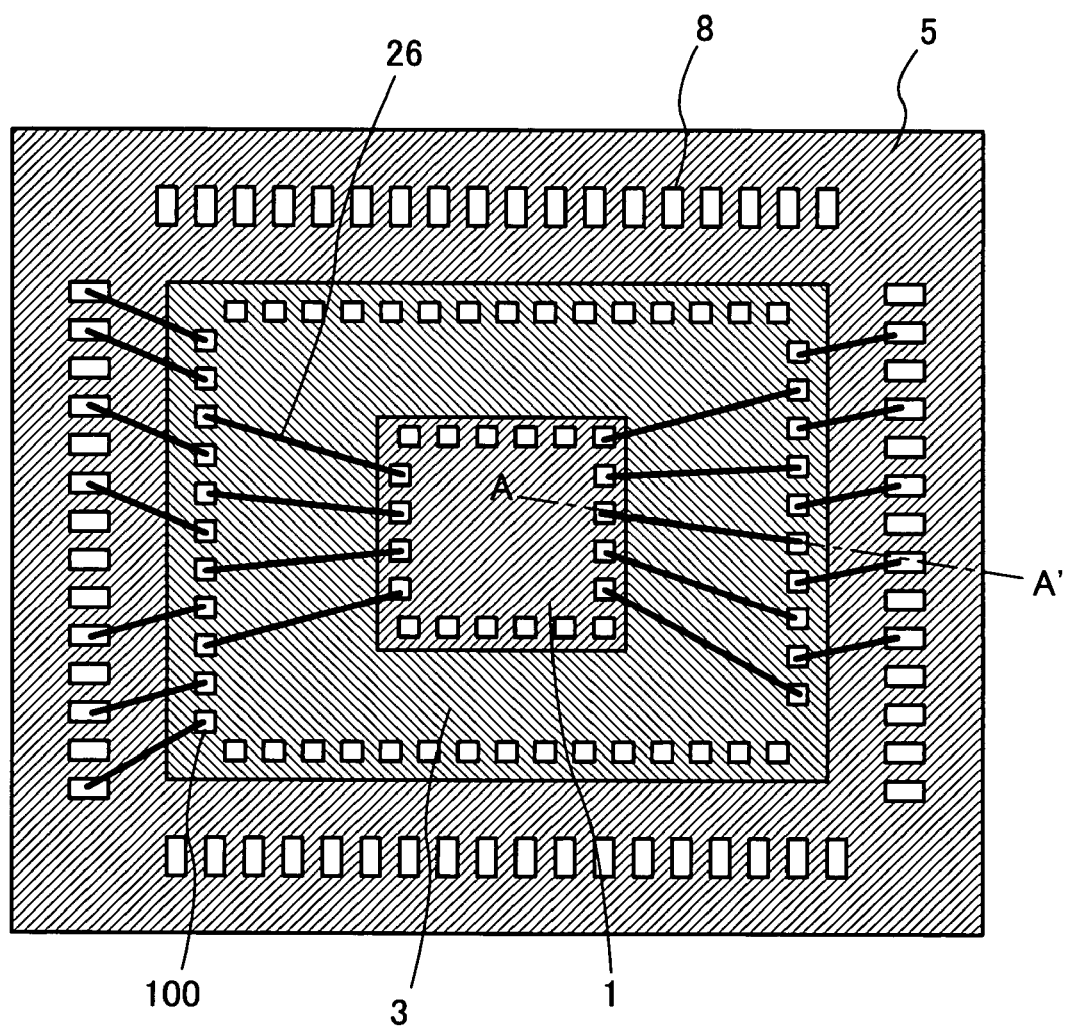
FIG. 6 is a plan view showing an MCP according to a first preferred embodiment of the present invention.

FIG. 6 is a plan view showing a MCP according to a first preferred embodiment of the present invention. FIG. 5 is a cross-sectional view taken on line A–A' in FIG. 6. The MCP includes a substrate 5, a first IC chip 3, mounted on the substrate 5 with an adhesive layer 4, and a second IC chip 1, mounted on the IC chip 3 with an adhesive layer 2. The adhesive layers 2 and 4 may be in a liquid state and have thermosetting property, or may be a thermoplastic sheet.

Bonding posts 8 are formed at a peripheral on the substrate 5. First bonding pads 100 are arranged on the first IC chip 3. The first and second IC chips 1 and 3 are connected with coated wires 6 to each other. The bonding pads 100 on the first IC chip 3 and the bonding posts 8 on the substrate 5 are also connected with the coated wires 6 in a wire bonding process. The second IC chip 1 is provided with aluminum pads 12 thereon to be bonded with ends of the coated wires 6. The IC chips 1 and 3 are molded with a resin 7.

Figure 7:
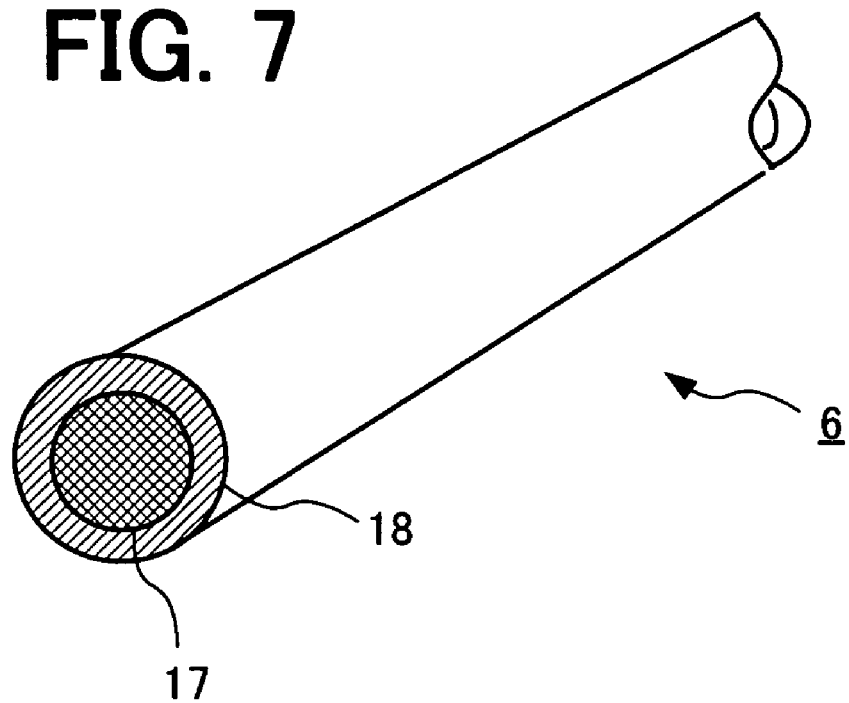
FIG. 7 is a perspective view showing a part of a coated wire.
Figure 8:
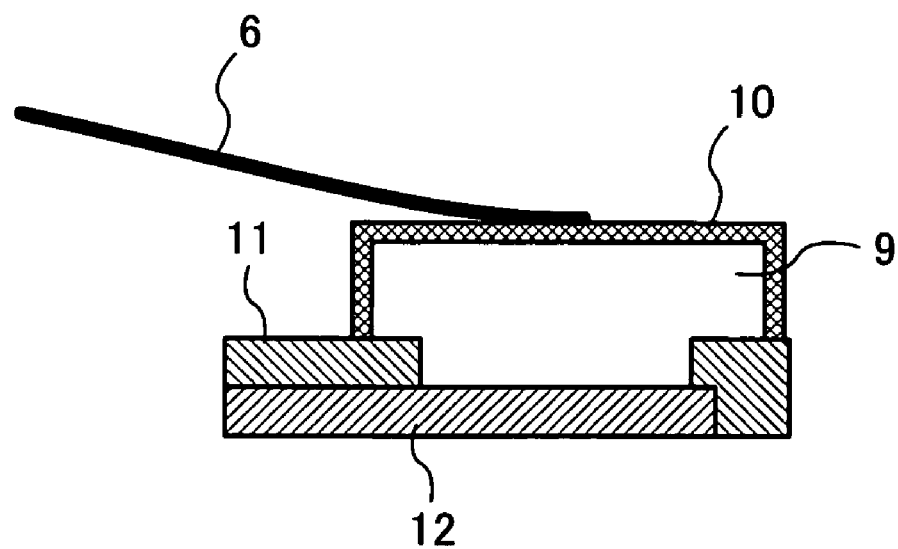
FIG. 8 is a cross-sectional view, corresponding to an encircled area C in FIG. 5, showing a conductive pad according to the present invention.

FIG. 7 is a perspective view showing the structure of the coated wire 6, which includes an Au wire core 17 and an insulation-coating layer 18. The insulation-coating layer 18 may be of an oxide layer or a resin layer having a thickness of 0.1 μm. FIG. 8 is a cross-sectional view, corresponding to an encircled area "C" in FIG. 5, showing the bonding pad 100. The bonding pad 100 includes a base layer (aluminum pad 12), a first conductive layer 9, an insulation layer 11 and a second conductive layer 10. The first conductive layer 9 is of Ni, which is formed on the aluminum pad 12 in an electroless deposition process to have a thickness of 3 to 5 μm.

The insulation layer 11 covers the corners of the aluminum pad 12 to from an exposed area at its center, as shown in FIG. 8 so that the Ni layer 9 is electrically in contact with the aluminum pad 12. The second conductive layer 10 is of Au, which is formed over the Ni layer 9 in an electroless deposition process to have a thickness of 0.05 to 0.1 μm.

In a wiring operation, a melted Au is formed at the end of a capillary, and the Au ball is moved onto the Au layer 10. Next, ultrasonic wave and stress is applied to the coated wire 6, so that the insulation coating 18 is broken and is bonded to the boding pad 100. After that, IC chips 1 and 3 are molded with the resin 7, and solder terminals 15 are provided on the bottom surface of the substrate 5. The substrate 5 may be cut to form a plurality of individual FBGA packages.

According to the above-described first preferred embodiment of the present invention, the IC chips 1 and 3 are prevented from being short-circuited. The bonding pads 100 are newly designed, so that stress applied to the IC chips in a wire-boding process can be decreased.

Figure 9:
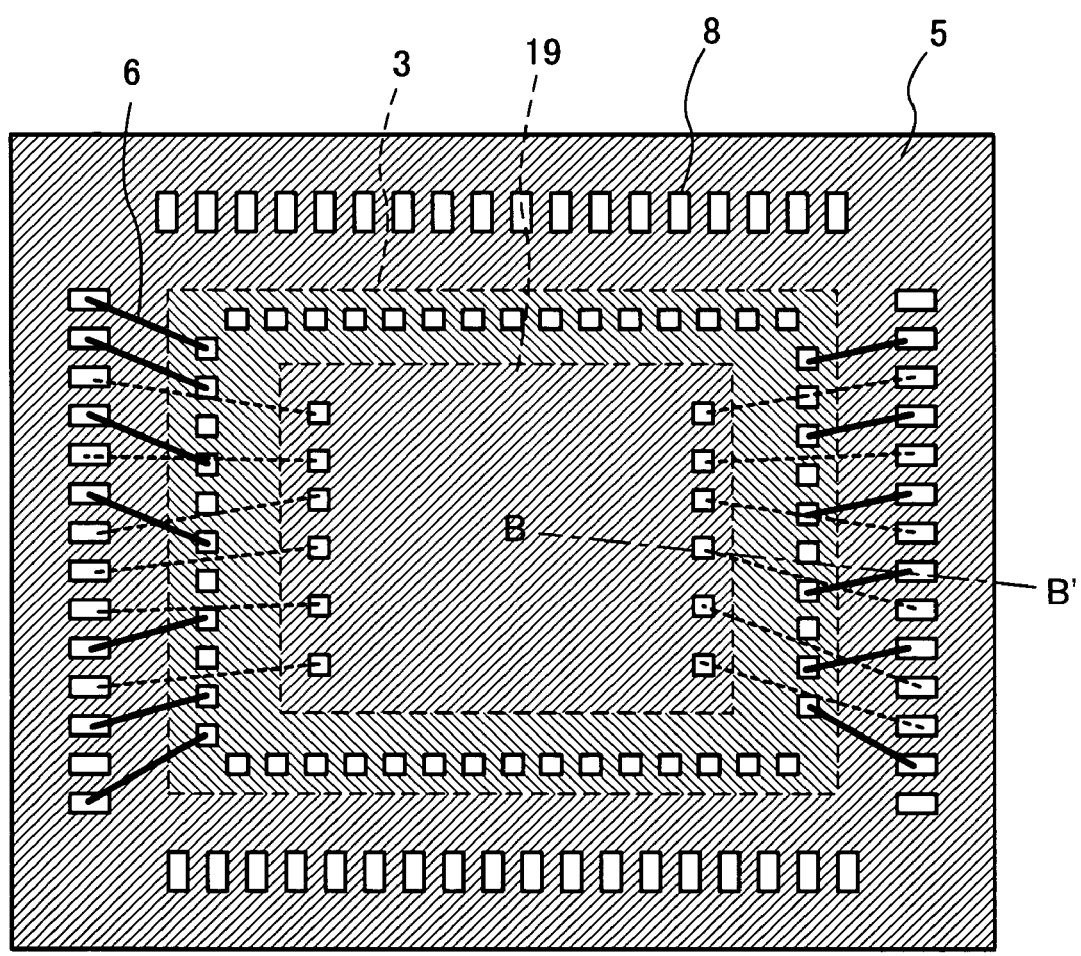
FIG. 9 is a plan view showing an MCP according to a second preferred embodiment of the present invention.
Figure 10:
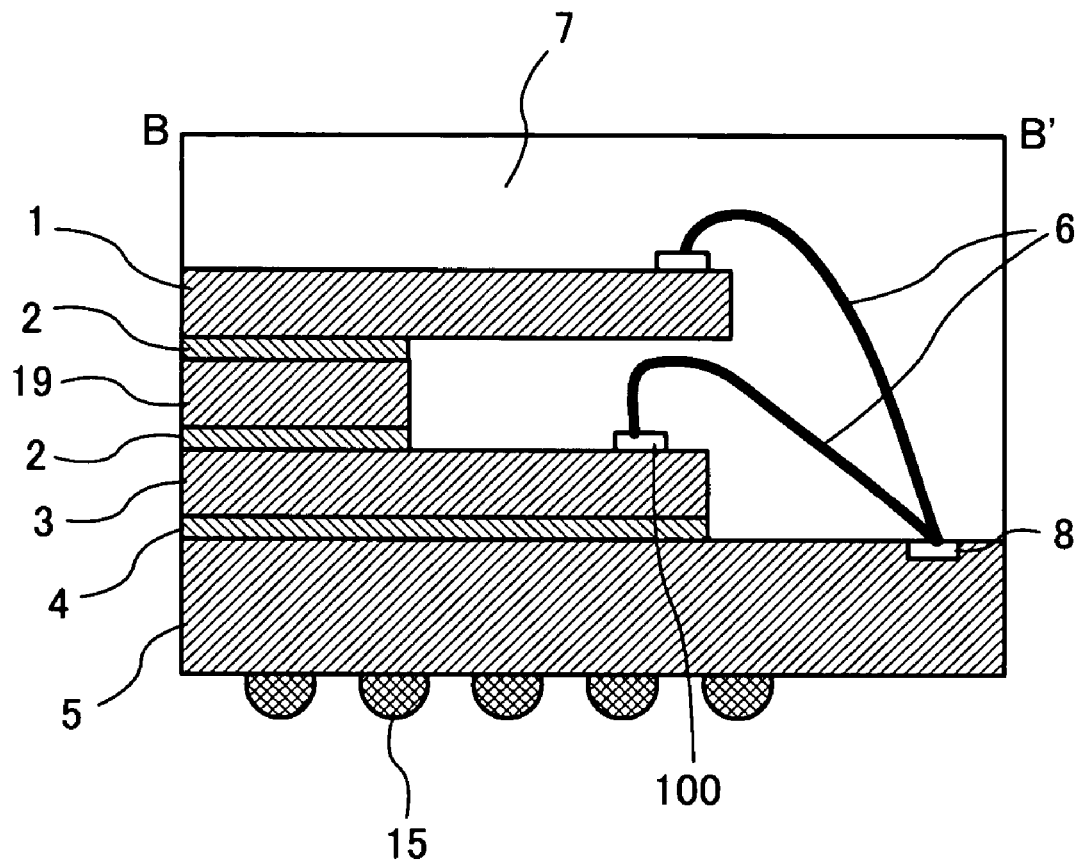
FIG. 10 is a cross-sectional view taken on line B–B' in FIG. 9.

FIG. 9 is a plan view showing a MCP according to a second preferred embodiment of the present invention. FIG. 10 is a cross-sectional view taken on line B–B' in FIG. 9. In this embodiment, the same and corresponding elements to those in the previously described embodiment(s) are indicated by the same reference numerals, and the same description is not repeated.

The MCP includes a substrate 5, a first IC chip 3, mounted on the substrate 5 with an adhesive layer 4, a spacer chip 19, mounted on the IC chip 3 with an adhesive layer 2, and a second IC chip 1, mounted on the space chip 19 with another adhesive layer 2. The adhesive layers 2 and 4 may be in a liquid state and have thermosetting property, or may be a thermoplastic sheet. The space ship 19 is shaped to be smaller in size than the first and second IC chips 3 and 1 and to have a thickness of 50 to 100 μm.

Bonding posts 8 are formed at a peripheral on the substrate 5. Bonding pads 100 are arranged on the first IC chip 3. The first and second IC chips 1 and 3 are connected with coated wires 6 to each other. The bonding pads 100 on the first IC chip 3 and the bonding posts 8 on the substrate 5 are also connected with the coated wires 6 in a wire bonding process. The second IC chip 1 is provided with aluminum pads 12 thereon to be bonded with ends of the coated wires 6. The IC chips 1 and 3 are molded with a resin 7.

In a wiring operation, a melted Au is formed at the end of a capillary, and the Au ball is moved onto the Au layer 10. Next, ultrasonic wave and stress is applied to the coated wire 6, so that the insulation coating 18 is broken and is bonded to the boding pad 100. After that, IC chips 1 and 3 are molded with the epoxy resin 7, and solder terminals 15 are provided on the bottom surface of the substrate 5. The substrate 5 may be cut to form a plurality of individual FBGA packages.

According to the above-described second preferred embodiment of the present invention, the IC chips 1 and 3 are prevented from being short-circuited. The bonding pads 100 are newly designed, so that stress applied to the IC chips in a wire-boding process can be decreased. Further, the package can be fabricated to be thinner, which can be applied to 1.4 mm or 1.2 mm type.

Figure 11:
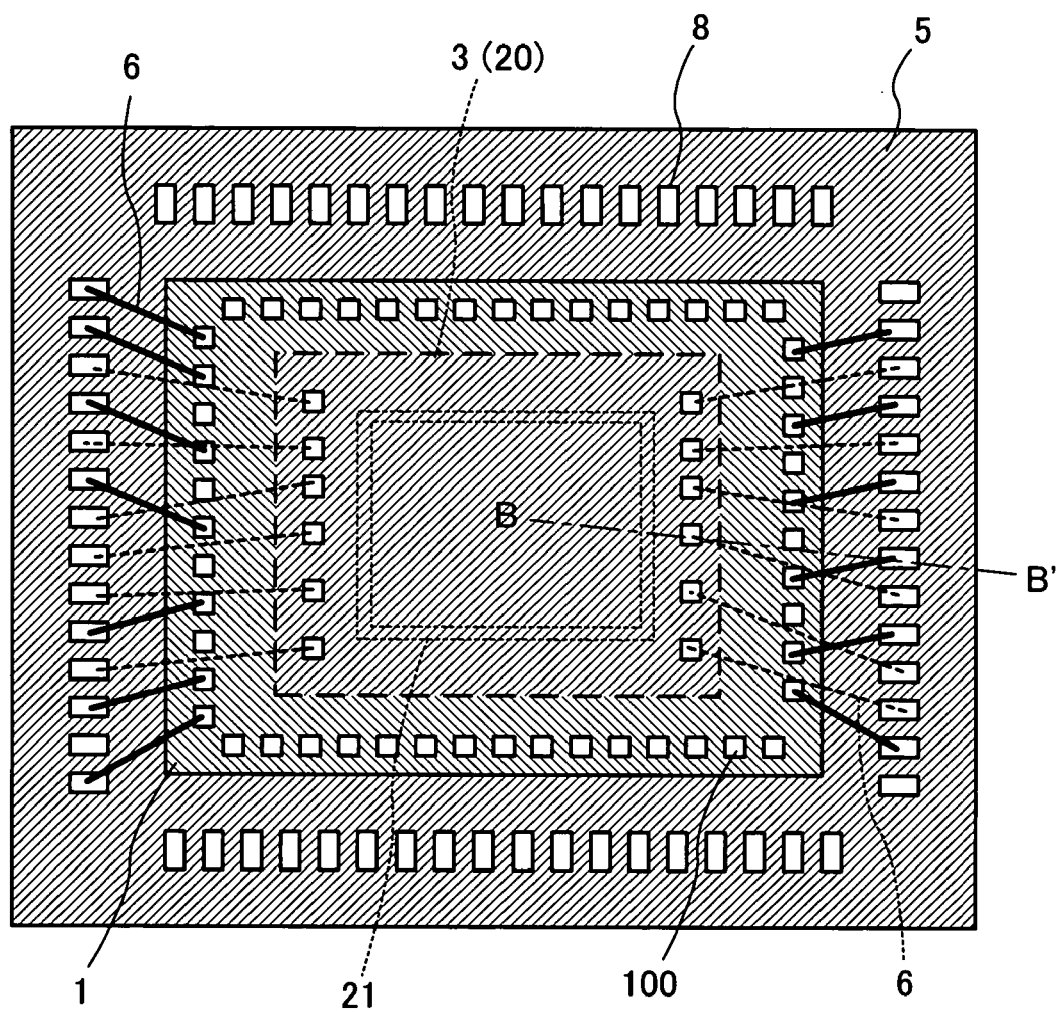
FIG. 11 is a plan view showing an MCP according to a third preferred embodiment of the present invention.
Figure 12:
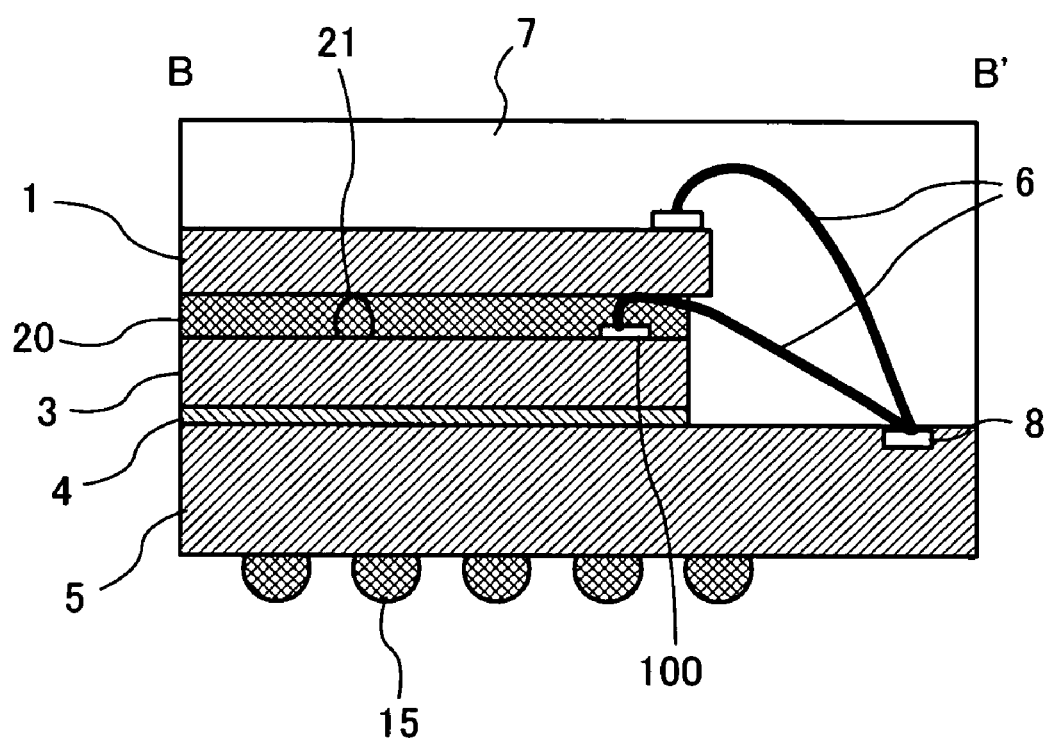
FIG. 12 is a cross-sectional view taken on line B–B' in FIG. 11.

FIG. 11 is a plan view showing a MCP according to a third preferred embodiment of the present invention. FIG. 12 is a cross-sectional view taken on line B–B' in FIG. 11. In this embodiment, the same and corresponding elements to those in the previously described embodiments are indicated by the same reference numerals, and the same description is not repeated.

The MCP includes a substrate 5, a first IC chip 3, mounted on the substrate 5 with an adhesive layer 4, a resin frame 21, mounted on the IC chip 3 with an adhesive material 20, and a second IC chip 1, mounted on the resin frame 21 with the adhesive material 20. The adhesive layer 4 may be in a liquid state and have thermosetting property, or may be a thermoplastic sheet. The IC chip 1 is not smaller in size than the IC chip 3, as shown in FIG. 12.

The resin frame 21 is shaped to be square and may be used for defining the height of boding wires 6. The adhesive material 20 may be in a liquid state. The resin frame 21 may be formed by setting a liquid state resin, coated on the IC chip 3. The resin frame 21 may be shaped to have a thickness of 25 to 50 μm. If the bonding wire 6 has a height larger than the thickness of the resin frame 21, the bonding wire 6 would be in contact with the bottom surface of the IC chip 1.

Bonding posts 8 are formed at a peripheral on the substrate 5. Bonding pads 100 are arranged on the first IC chip 3. The first and second IC chips 1 and 3 are connected with coated wires 6 to each other. The bonding pads 100 on the first IC chip 3 and the bonding posts 8 on the substrate 5 are also connected with the coated wires 6 in a wire bonding process. The second IC chip 1 is provided with aluminum pads 12 thereon to be bonded with ends of the coated wires 6. The IC chips 1 and 3 are molded with a resin 7.

In a wiring operation, a melted Au is formed at the end of a capillary, and the Au ball is moved onto the Au layer 10. Next, ultrasonic wave and stress is applied to the coated wire 6, so that the insulation coating 18 is broken and is bonded to the boding pad 100. After that, IC chips 1 and 3 are molded with the epoxy resin 7, and solder terminals 15 are provided on the bottom surface of the substrate 5. The substrate 5 may be cut to form a plurality of individual FBGA packages.

According to the above-described third preferred embodiment of the present invention, the IC chips 1 and 3 are prevented from being short-circuited. The bonding pads 100 are newly designed, so that stress applied to the IC chips in a wire-boding process can be decreased. Further, the package can be fabricated to have a thickness that is thinner than 1.2 mm.

Figure 13:
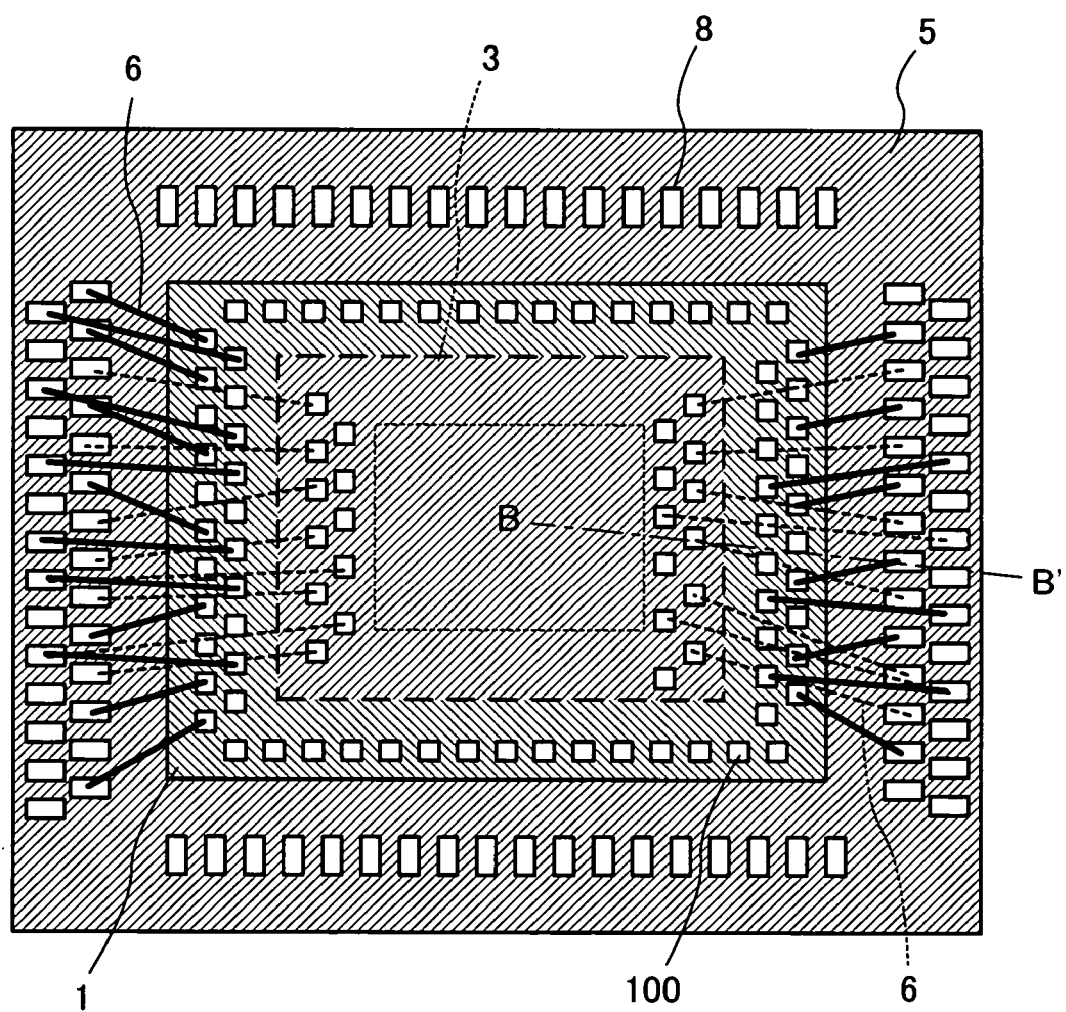
FIG. 13 is a plan view showing an MCP according to a fourth preferred embodiment of the present invention.
Figure 14:
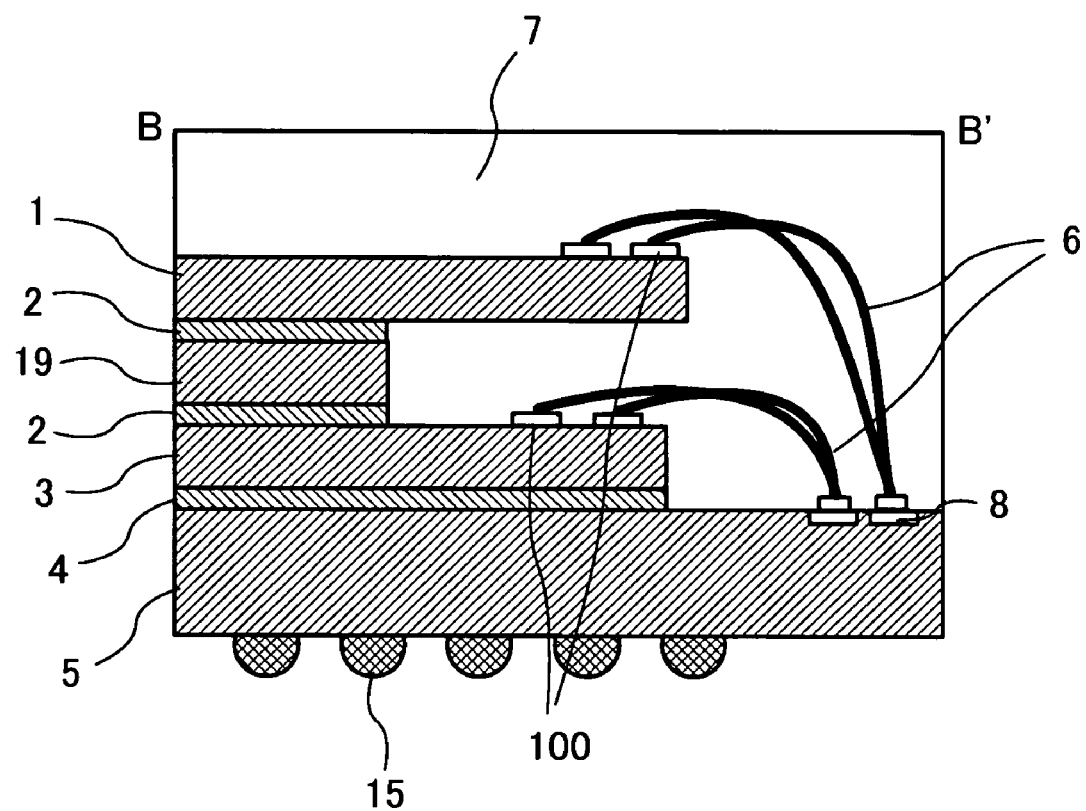
FIG. 14 is a cross-sectional view taken on line B–B' in FIG. 14.

FIG. 13 is a plan view showing a MCP according to a fourth preferred embodiment of the present invention. FIG. 14 is a cross-sectional view taken on line B–B' in FIG. 13. In this embodiment, the same and corresponding elements to those in the previously described embodiments are indicated by the same reference numerals, and the same description is not repeated.

The MCP includes a substrate 5, a first IC chip 3, mounted on the substrate 5 with an adhesive layer 4, a spacer chip 19, mounted on the IC chip 3 with an adhesive layer 2, and a second IC chip 1, mounted on the space chip 19 with another adhesive layer 2. The adhesive layers 2 and 4 may be in a liquid state and have thermosetting property, or may be a thermoplastic sheet. The space ship 19 is shaped to be smaller in size than the first and second IC chips 3 and 1 and to have a thickness of 50 to 100 μm.

Bonding posts 8 are arranged at a peripheral on the substrate 5 in grid manner or lattice shape. Bonding pads 100 are arranged on the first IC chip 3 and the second IC chip 1. The bonding pads 100 are connected to the bonding posts 8 on the substrate 5 with the coated wires 6 in a wire bonding process. The IC chips 1 and 3 are molded with a resin 7.

In a wiring operation, a melted Au is formed at the end of a capillary, and the Au ball is moved onto the Au layer 10. Next, ultrasonic wave and stress is applied to the coated wire 6, so that the insulation coating 18 is broken and is bonded to the boding pad 100. After that, IC chips 1 and 3 are molded with the epoxy resin 7, and solder terminals 15 are provided on the bottom surface of the substrate 5. The substrate 5 may be cut to form a plurality of individual FBGA packages.

According to the above-described fourth preferred embodiment of the present invention, the IC chips 1 and 3 are prevented from being short-circuited. The bonding pads 100 are newly designed, so that stress applied to the IC chips in a wire-boding process can be decreased. Further, the package can be fabricated to have a thickness of 1.4 mm or 1.2 mm.

Figure 15:
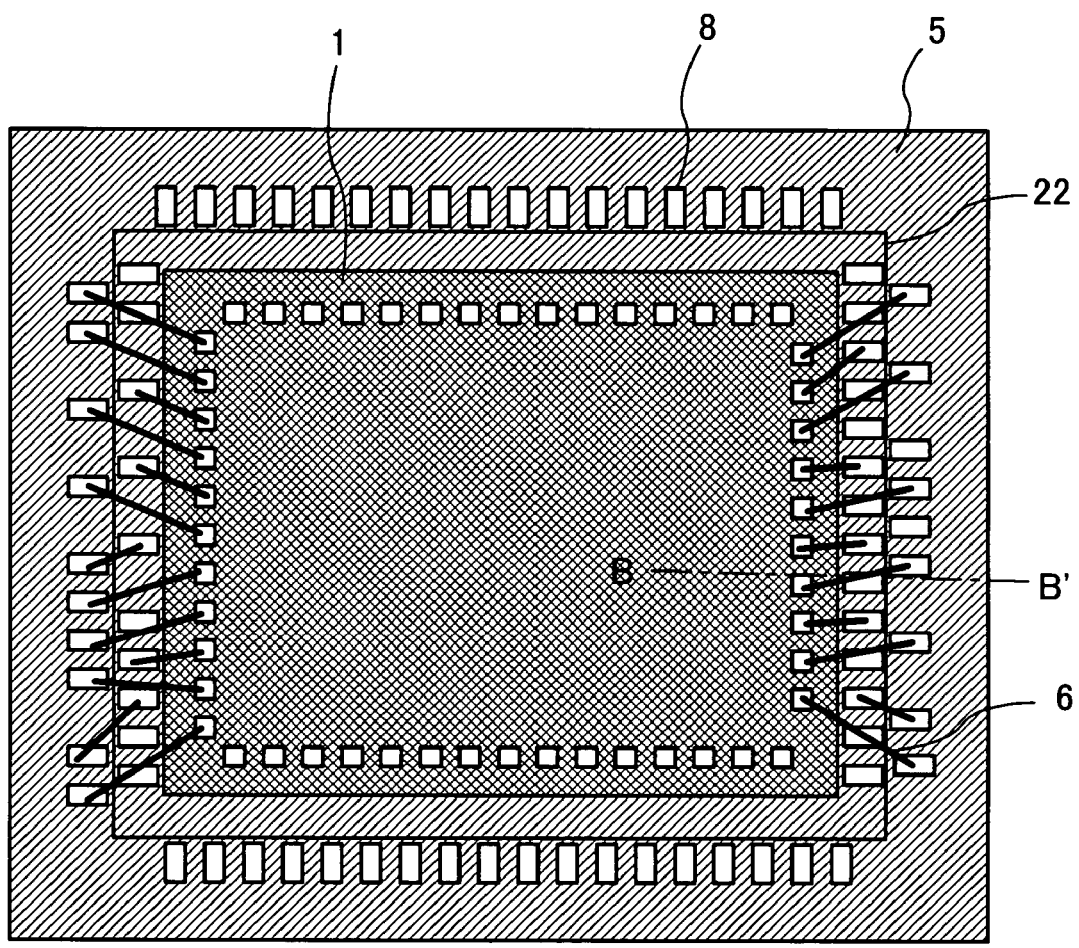
FIG. 15 is a plan view showing an MCP according to a fifth preferred embodiment of the present invention.
Figure 16:
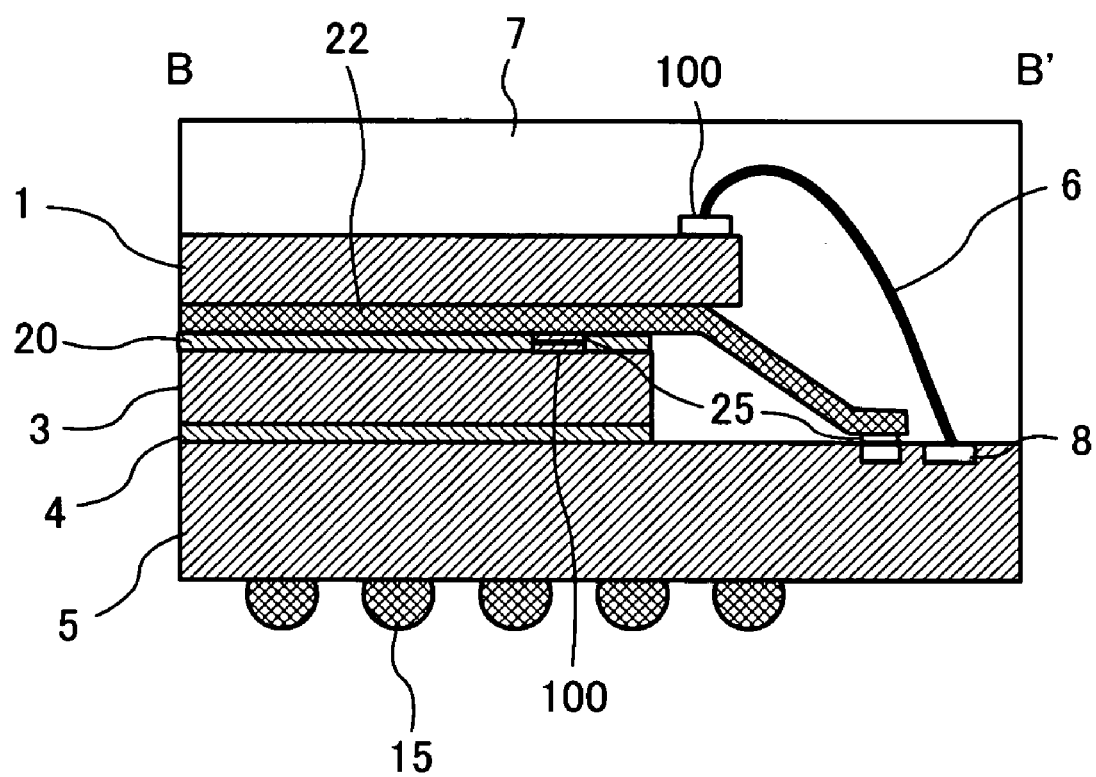
FIG. 16 is a cross-sectional view taken on line B–B' in FIG. 15.
Figure 17:
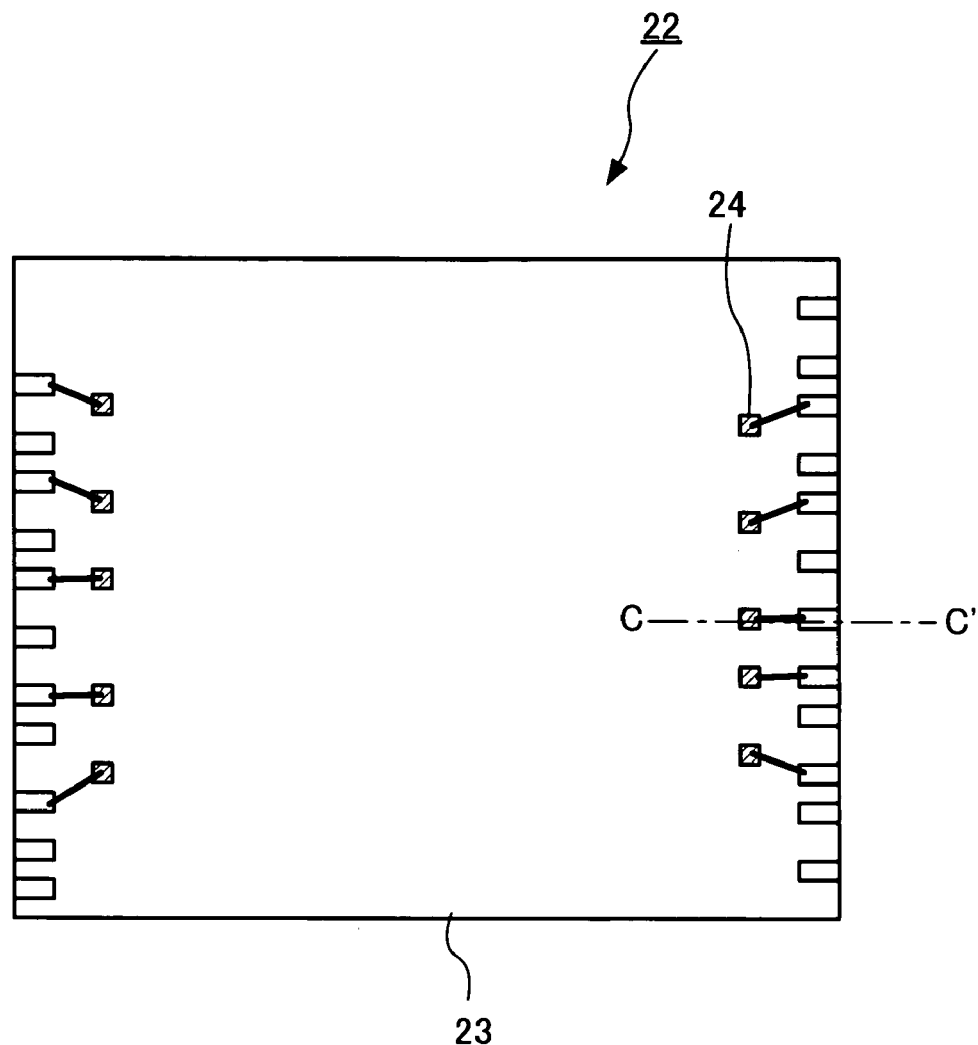
FIG. 17 is a plan view showing a wiring sheet used in the fifth preferred embodiment shown in FIGS. 15 and 16.
Figure 18:
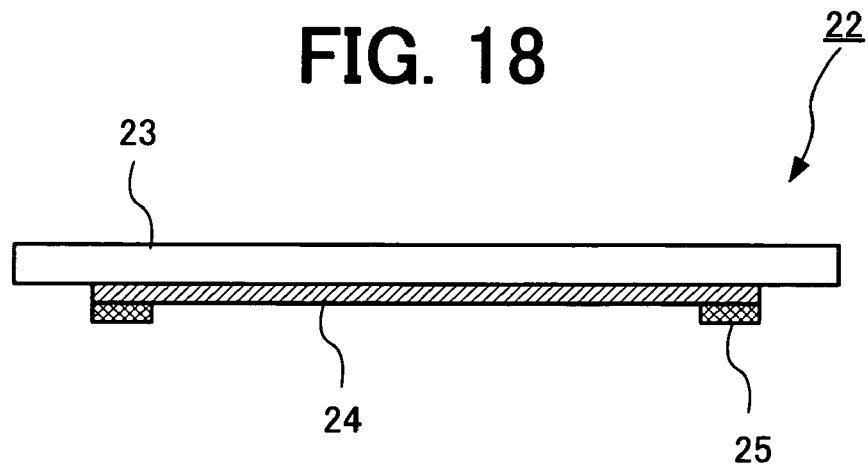
FIG. 18 is a cross sectional view taken on line C–C' in FIG. 17.

FIG. 15 is a plan view showing a MCP according to a fifth preferred embodiment of the present invention. FIG. 16 is a cross-sectional view taken on line B–B' in FIG. 15. FIG. 17 is a plan view showing a wiring sheet used in the fifth preferred embodiment shown in FIGS. 15 and 16. FIG. 18 is a cross sectional view taken on line C–C' in FIG. 17. In this embodiment, the same and corresponding elements to those in the previously described embodiments are indicated by the same reference numerals, and the same description is not repeated.

The MCP includes a substrate 5, a first IC chip 3, mounted on the substrate 5 with an adhesive layer 4, a wiring sheet 22, arranged on the IC chip 3 with an adhesive material 20, and a second IC chip 1, mounted on the wiring sheet 22 with an adhesive layer 2. The adhesive layers 2 and 4 may be in a liquid state and have thermosetting property, or may be a thermoplastic sheet. The IC chip 1 is not smaller in size than the IC chip 3, as shown in FIG. 16.

As shown in FIGS. 17 and 18, the wiring sheet 22 includes a base tape 23, a conductive pattern 24 formed on the base tape 23; and conductive bumps 25 formed on the conductive pattern 24 so that the conductive bumps 25 are electrically connected to the bonding pads 100 and to bonding posts 8, which is formed on the substrate 5. The conductive pattern 24 may be formed by a Cu pattern. The base tape 23 is made of a polyimide or Teflon (a synthetic resin) to have a thickness of 10 to 25 μm. The wiring pattern 24 may be formed to have a thickness of 5 to 12 μm. The conductive bumps 25 may be of metal and have a thickness of 5 to 10 μm.

The bonding pads 100 and the conductive bumps 25 may be connected or fixed to each other by metal diffusion technique (Au—Au) or fusion bonding technique (Au—Sn).

Bonding posts 8 are formed at a peripheral on the substrate 5. Bonding pads 100 are arranged on the first and second IC chips 3 and 1. The second IC chip 1 is connected with coated wires 6 to the bonding posts 8 on the substrate 5. The bonding pads 100 on the first IC chip 3 and the bonding posts substrate 5 are bonding pads 100 on the first IC chip 3 and the bonding posts 8 on the substrate 5 are connected with the wiring sheet 22. The IC chips 1 and 3 are molded with a resin 7.

In a wiring operation, a melted Au is formed at the end of a capillary, and the Au ball is moved onto the Au layer 10. Next, ultrasonic wave and stress is applied to the coated wire 6, so that the insulation coating 18 is broken and is bonded to the boding pad 100. After that, IC chips 1 and 3 are molded with the epoxy resin 7, and solder terminals 15 are provided on the bottom surface of the substrate 5. The substrate 5 may be cut to form a plurality of individual FBGA packages.

According to the above-described fifth preferred embodiment of the present invention, the IC chips 1 and 3 are prevented from being short-circuited. The bonding pads 100 are newly designed, so that stress applied to the IC chips in a wire-boding process can be decreased. Further, the package can be fabricated to have a thickness that is thinner than 1.2 mm. In addition, the fundamental design of wiring, such as the arrangement of the bonding posts 8, becomes more flexible.

Figure 19:
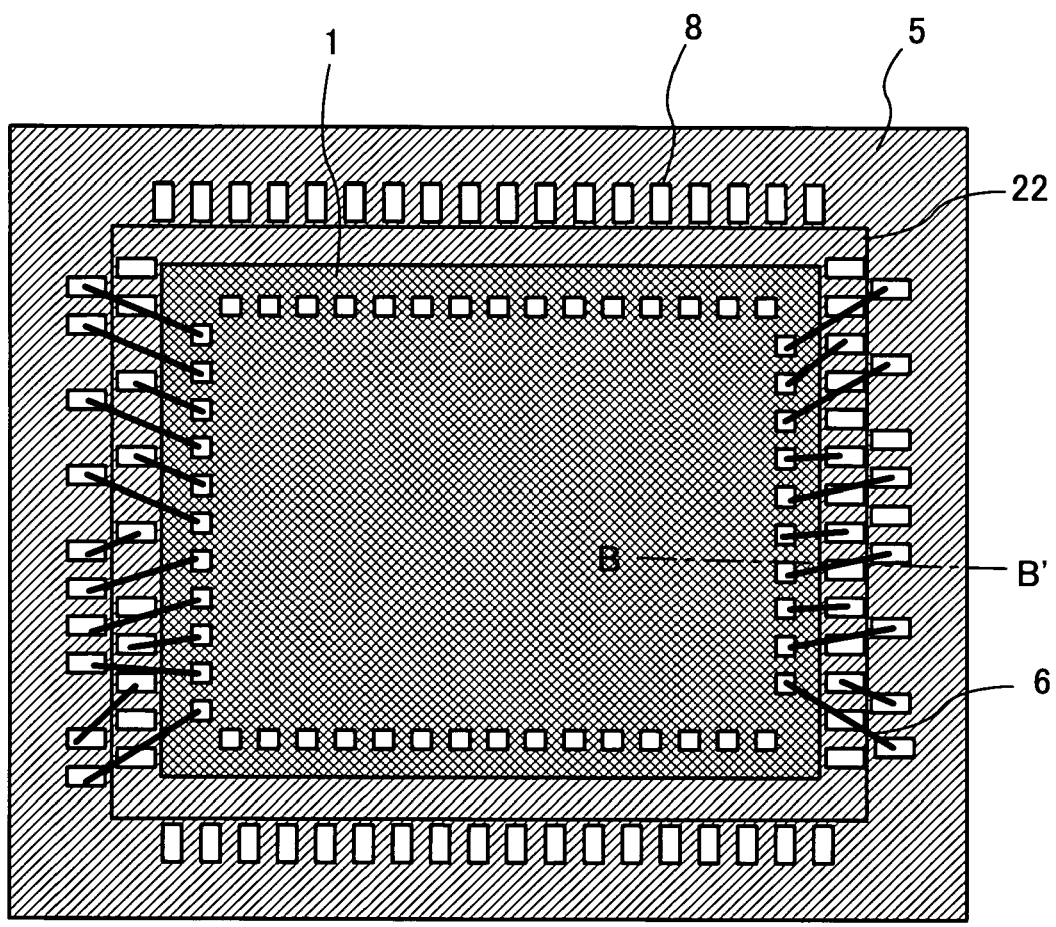
FIG. 19 is a plan view showing an MCP according to a sixth preferred embodiment of the present invention.
Figure 20:
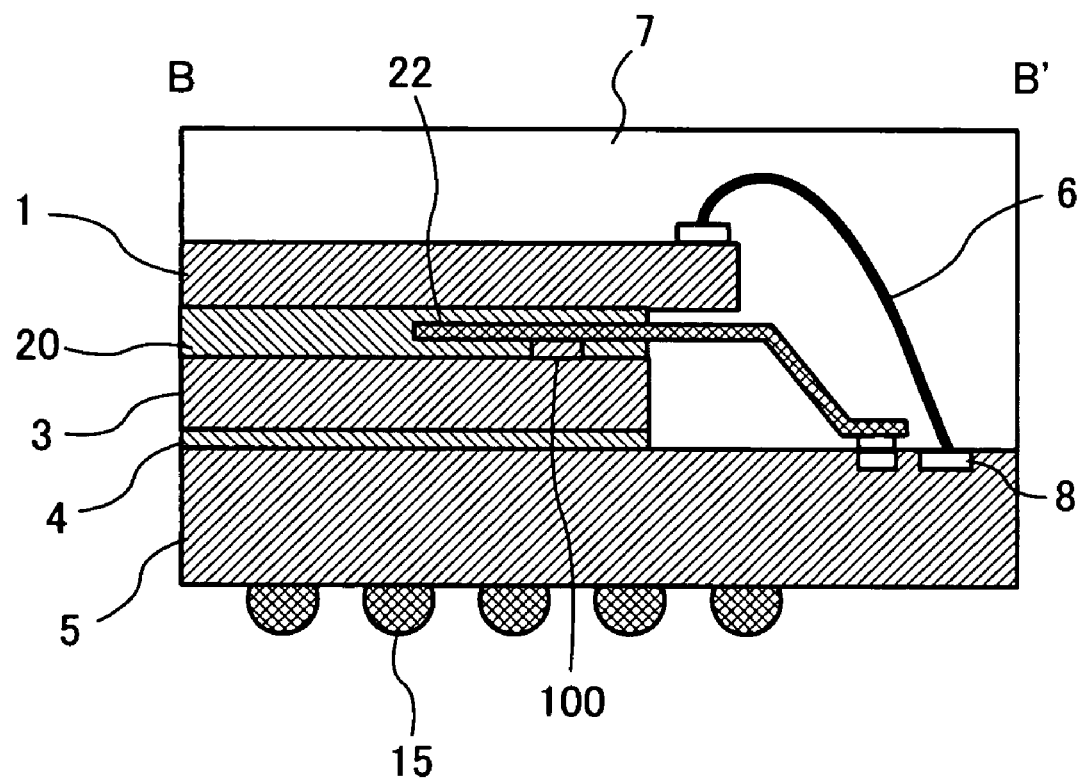
FIG. 20 is a cross-sectional view taken on line B–B' in FIG. 19.
Figure 21:
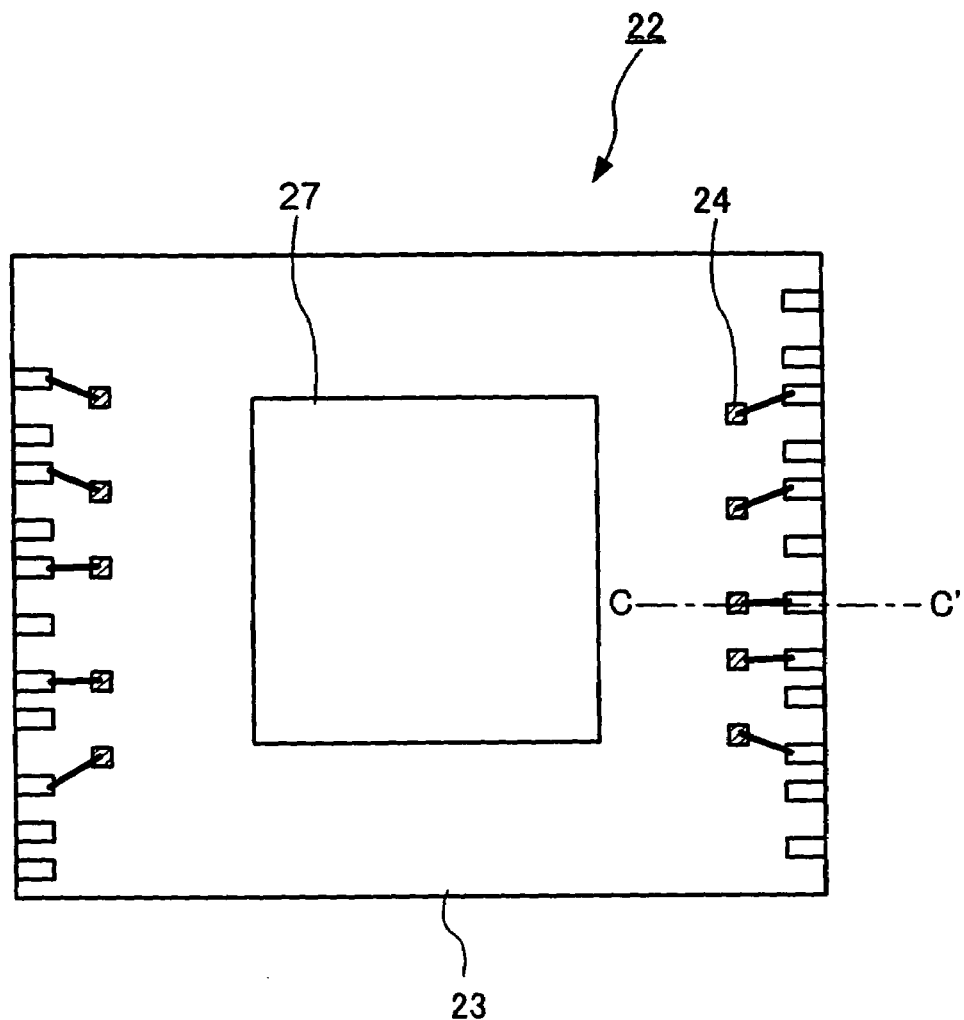
FIG. 21 is a plan view showing a wiring sheet used in the sixth preferred embodiment shown in FIGS. 19 and 20.
Figure 22:
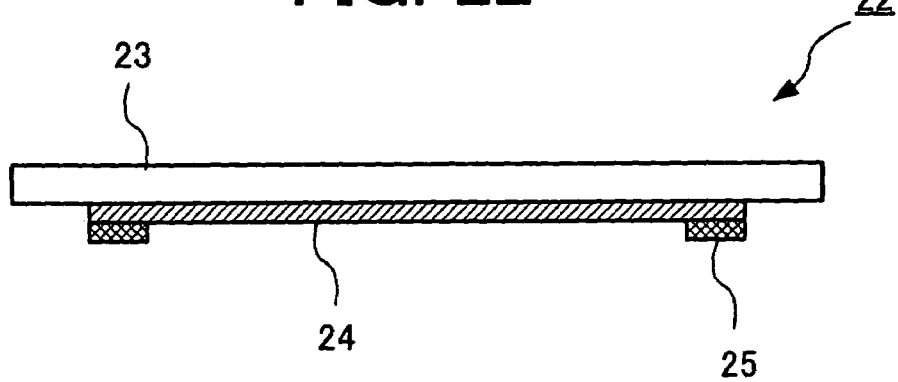
FIG. 22 is a cross sectional view taken on line C–C' in FIG. 21.

FIG. 19 is a plan view showing a MCP according to a sixth preferred embodiment of the present invention. FIG. 20 is a cross-sectional view taken on line B–B' in FIG. 19. FIG. 21 is a plan view showing a wiring sheet used in the sixth preferred embodiment shown in FIGS. 19 and 20. FIG. 22 is a cross sectional view taken on line C–C' in FIG. 21. In this embodiment, the same and corresponding elements to those in the previously described embodiments are indicated by the same reference numerals, and the same description is not repeated.

The MCP includes a substrate 5, a first IC chip 3, mounted on the substrate 5 with an adhesive layer 4, a wiring sheet 22, arranged on the IC chip 3 with an adhesive material 20, and a second IC chip 1, mounted on the wiring sheet 22 with the adhesive material 20. The adhesive layer 4 may be in a liquid state and have thermosetting property, or may be a thermoplastic sheet. The IC chip 1 is not smaller in size than the IC chip 3, as shown in FIG. 16.

As shown in FIGS. 21 and 22, the wiring sheet 22 includes a base tape 23, a conductive pattern 24 formed on base tape 23; and conductive bumps 25 formed on the conductive pattern 24 so that the conductive bumps 25 are electrically connecting to the bonding pads 100 and to bonding post 8,which is formed on the substrate 5. The conductive pattern 24 may be formed by a Cu pattern. The base tape 23 is made of a polyimide or Teflon(a synthetic resin) to have a thickness of 10 to 25 μm. The wiring pattern 24 may be formed to have a thickness of 5 to 12 μm. The conductive bumps 25 may be metal and have a thickness of 5 to 10 μ. The wiring sheet 22 is provided with a square opening 27 at its center.

The bonding pads 100 and the conductive bumps 25 may be connected or fixed to each other by metal diffusion technique (Au—Au) or fusion bonding technique (Au—Sn).

Bonding posts 8 are formed at a peripheral on the substrate 5. Bonding pads 100 are arranged on the first and second IC chips 3 and 1. The second IC chip 1 is connected with coated wires 6 to the bonding posts 8 on the substrate 5. The bonding pads 100 on the first IC chip 3 and the bonding posts substrate 5 are bonding pads 100 on the first IC chip 3 and the bonding posts 8 on the substrate 5 are connected with the wiring sheet 22. The IC chips 1 and 3 are molded with a resin 7.

In a wiring operation, a melted Au is formed at the end of a capillary, and the Au ball is moved onto the Au layer 10. Next, ultrasonic wave and stress is applied to the coated wire 6, so that the insulation coating 18 is broken and is bonded to the boding pad 100. After that, IC chips 1 and 3 are molded with the epoxy resin 7, and solder terminals 15 are provided on the bottom surface of the substrate 5. The substrate 5 may be cut to form a plurality of individual FBGA packages.

According to the aboved-discribed sixth preferred embodiment of the present invention, the IC chips 1 and 3 are prevented from being short-circuited. The bonding pads 100 are newly designed, so that stress applied to the IC chips in a wire-bonding process can be decressed. Further, the package can be fabricated to have a thickness that is thinner then 1.2 mm. In addition, fundimental design of wiring,such as the arrangement of the bonding post8, becomes more flexable. Still further,the opening 27 is formed on the wiring sheet 22, so that adhesive layer 2 in the fifth preferred embodiment may be omitted

What is claimed is:

1. A multi chip package comprising:
   a substrate;
   a first semiconductor chip mounted on the substrate;
   a second semiconductor chip mounted above the first semiconductor chip;
   a first bonding wire electrically coupled by wire bonding to a first wire bonding pad on the first semiconductor chip; and
   a second bonding wire electrically coupled by wire bonding to a second wire bonding pad on the second semiconductor chip, wherein
   at least the first bonding wire is a coated wire, which comprises a conductive core and an outer insulation coating,
   at least the first wire bonding pad is a multi layered pad, comprising a base pad formed on the first semiconductor chip; a first conductive layer of nickel (Ni) formed on the base pad; and a second conductive layer of gold (Au) formed on the first conductive layer.

2. A multi chip package according to claim 1, wherein the base pad is of aluminum.

3. A multi chip package according to claim 1, wherein
   at least the first bonding pad further comprises an insulation layer formed on the base pad so as to expose an area where the first conductive layer is electrically coupled.

4. A multi chip package according to claim 1, wherein the first bonding wire comprises a wire connecting the first bonding pad to the second bonding pad.

5. A multi chip package according to claim 4, wherein the base pad is of aluminum.

6. A multi chip package according to claim 4, wherein
   at least the first bonding pad further comprises an insulation layer formed on the base pad so as to expose an area where the first conductive layer is electrically coupled.

7. A multi chip package according to claim 1, further comprising:
   a spacer chip formed between the first semiconductor chip and the second semiconductor chip.

8. A multi chip package according to claim 7, wherein the base pad is of aluminum.

9. A multi chip package according to claim 7, wherein
   at least the first bonding pad further comprises an insulation layer formed on the base pad so as to expose an area where the first conductive layer is electrically coupled.

10. A multi chip package according to claim 1, further comprising:
    a resin frame arranged at an inner area of the first conductive pad to form a certain distance between the first semiconductor chip and the second semiconductor chip; and
    a liquid state adhesive fixing the resin frame in position.

11. A multi chip package according to claim 10, wherein the base pad is of aluminum.

12. A multi chip package according to claim 10, wherein
    at least the first bonding pad further comprises an insulation layer formed on the base pad so as to expose an area where the first conductive layer is electrically coupled.

13. A multi chip package according to claim 1, wherein
    a plurality of the first conductive pad are arranged in grid,
    a plurality of the second conductive pad are arranged in grid,
    each of the first and second conductive wires is of the coated wire, and
    each of the first and second bonding pads is of the multi layered pad.

14. A multi chip package according to claim 13, wherein the base pad is of aluminum.

15. A multi chip package according to claim 13, wherein at least the first bonding pad further comprises an insulation layer formed on the base pad so as to expose an area where the first conductive layer is electrically coupled.

16. A multi chip package according to claim 1, further comprising:
a wiring sheet arranged between the first semiconductor chip and the second semiconductor chip, wherein
the wiring sheet comprises a base tape; a conductive pattern formed on the base tape; and conductive bumps formed on the conductive pattern so that the conductive bumps are electrically connected to the first conductive pad and to a bonding post, which is formed on the substrate.

17. A multi chip package according to claim 16, wherein the base pad is of aluminum.

18. A multi chip package according to claim 16, wherein at least the first bonding pad further comprises an insulation layer formed on the base pad so as to expose an area where the first conductive layer is electrically coupled.

19. A multi chip package, comprising:
a substrate;
a first semiconductor chip mounted on the substrate;
a second semiconductor chip mounted above the first semiconductor chip;
a first bonding wire electrically coupled to a first bonding pad on the first semiconductor chip; and
a second bonding wire electrically coupled to a second bonding pad on the second semiconductor chip, wherein
at least the first bonding wire is of a coated wire, which comprises a conductive core and an outer insulation coating,
at least the first bonding pad is of a multi layered pad, comprising a base pad formed on the first semiconductor chip; a first conductive layer formed on the base pad; and a second conductive layer formed on the first conductive layer
a wiring sheet arranged between the first semiconductor chip and the second semiconductor chip,
the wiring sheet comprises a base tape; a conductive pattern formed on the base tape; and conductive bumps formed on the conductive pattern so that the conductive bumps are electrically connected to the first conductive pad and to a bonding post, which is formed on the substrate, and
the wiring sheet is shaped to have an opening at its center, where none of the first conductive pad and second conductive pad is formed.

20. A multi chip package according to claim 19, wherein the base pad is of aluminum.

21. A multi chip package according to claim 19, wherein the first conductive layer is of nickel (Ni).

22. A multi chip package according to claim 19, wherein the second conductive layer is of gold (Au).

23. A multi chip package according to claim 19, wherein the base pad is of aluminum;
the first conductive layer is of nickel (Ni); and
the second conductive layer is of gold (Au).

24. A multi chip package according to claim 23, wherein the first and second conductive layers are formed by electroless deposition technique.

25. A multi chip package according to claim 23, wherein the first and second conductive layers are formed to have a thickness of 3 to 5 µm and a thickness of 0.05 to 0.1 µm, respectively.

26. A multi chip package according to claim 19, wherein at least the first bonding pad further comprises an insulation layer formed on the base pad so as to expose an area where the first conductive layer is electrically coupled.

* * * * *